United States Patent
Tsuchiya et al.

(10) Patent No.: US 10,935,576 B2
(45) Date of Patent: Mar. 2, 2021

(54) DETERMINATION OF OPERATION STATUS OF SHUT-OFF ELEMENT OF BATTERY MODULE

(71) Applicant: Keihin Corporation, Tokyo (JP)

(72) Inventors: Shingo Tsuchiya, Shioya-gun (JP); Seiji Kamata, Shioya-gun (JP)

(73) Assignee: KEIHIN CORPORATION, Tochigi (JP)

( * ) Notice: Subject to any disclaimer, the term of this patent is extended or adjusted under 35 U.S.C. 154(b) by 82 days.

(21) Appl. No.: 16/242,182

(22) Filed: Jan. 8, 2019

(65) Prior Publication Data
US 2019/0293693 A1  Sep. 26, 2019

(30) Foreign Application Priority Data

Mar. 26, 2018 (JP) .............................. JP2018-057399

(51) Int. Cl.
| | |
|---|---|
| *G01N 27/416* | (2006.01) |
| *G01R 31/327* | (2006.01) |
| *H02J 7/00* | (2006.01) |
| *G01R 19/165* | (2006.01) |
| *B60L 58/21* | (2019.01) |
| *H01M 10/48* | (2006.01) |
| *G01R 31/396* | (2019.01) |
| *G01R 31/3842* | (2019.01) |

(52) U.S. Cl.
CPC ........ *G01R 19/16542* (2013.01); *B60L 58/21* (2019.02); *G01R 31/3842* (2019.01); *G01R 31/396* (2019.01); *H01M 10/482* (2013.01); *H02J 7/007* (2013.01); *H02J 7/0021* (2013.01)

(58) Field of Classification Search
CPC .............. G01R 31/396; G01R 31/3842; G01R 31/3835; H02J 7/00; H02J 7/007; H02J 7/0021; H01M 10/425; H01M 10/482; B60L 58/21
See application file for complete search history.

(56) References Cited

U.S. PATENT DOCUMENTS

| 7,573,234 B1 * | 8/2009 | Tsukamoto | ......... H01M 10/441 |
| | | | 320/116 |
| 2004/0164706 A1 * | 8/2004 | Osborne | ............... H02J 7/0018 |
| | | | 320/116 |
| 2011/0148361 A1 | 6/2011 | Yokotani | |
| 2014/0175873 A1 * | 6/2014 | Kishimoto | .............. B60L 53/14 |
| | | | 307/10.1 |

FOREIGN PATENT DOCUMENTS

JP  2011-135657 A  7/2011

* cited by examiner

*Primary Examiner* — Minh N Tang
(74) *Attorney, Agent, or Firm* — Westerman, Hattori, Daniels & Adrian, LLP

(57) ABSTRACT

In a voltage detection apparatus for detecting voltage of battery modules, it is possible to detect that a shut-off element performed operation in a certain one of a plurality of battery modules connected in parallel. The voltage detection apparatus detects voltage of the plurality of battery modules each including a shut-off element and connected in parallel with respect to a load, and decides whether the shut-off elements are operating based on the cell voltage in a state that the plurality of battery modules are disconnected from a power supply line by switching wares.

6 Claims, 3 Drawing Sheets

US 10,935,576 B2

DETERMINATION OF OPERATION STATUS OF SHUT-OFF ELEMENT OF BATTERY MODULE

TECHNICAL FIELD

The present application relates to a voltage detection apparatus.

BACKGROUND

For example, Japanese Patent Publication No. 2011-135657 discloses a battery system formed by connecting battery modules in parallel which have a plurality of battery cells connected in series. It is possible to increase output current of the battery system by connecting the plurality of battery modules in parallel in this way.

SUMMARY

However, some battery modules for vehicles are provided with a shut-off element called a CID (Current Interrupt Device). The CID is connected in series to each of the plurality of battery cells constituting the battery modules, and causes the output of each battery cell not to be supplied to outside by mechanically disconnecting one terminal of each battery cell. If such shut-off element operates, the connection between the battery cells is shut off, such that the output of the battery modules is stopped.

However, operation of the shut-off element in the conventional battery modules is performed in a voltage detection apparatus for detecting voltage of the battery modules. Therefore, in a case where the battery modules are connected in parallel, the output voltage of the battery system does not change even if the shut-off element operates in an arbitrary battery module, and thus the operation of the shut-off element cannot be detected by the voltage detection apparatus.

The present application is proposed in view of the above problems, and the purpose thereof is to detect the operation of the shut-off element in a certain one of the plurality of battery modules connected in parallel in the voltage detection apparatus for detecting voltage of the battery modules.

In the present application, as means for solving the above problems, the following structures are adopted.

The present application provides a voltage detection apparatus which detects voltage of a plurality of battery modules each having a shut-off element and connected in parallel with respect to a load. The voltage detection apparatus comprises: a switching ware which is set for each of the battery modules and connects the battery modules to a power supply line for the load; a cell voltage detecting portion which detects voltage of a battery cell included in the battery module in a state that the battery module is disconnected from the power supply line by the switching ware; and a deciding portion which decides whether the shut-off element of the battery module is operating based on detection results of the cell voltage detecting portion.

In the present application, the deciding portion decides that the shut-off element of the battery module is operating in a case where a result indicating that the voltage of the battery cell is negative voltage is included in the detection results of the cell voltage detecting portion.

In the present application, the deciding portion decides whether the shut-off element of the battery module is operating based on the detection results of the cell voltage detecting portion in a state that current flows in a current path including a leakage current path included in the shut-off element after operation.

In the present application, the deciding portion decides whether the shut-off element of the battery module is operating based on the detection results of the cell voltage detecting portion in a state that current flows in a current path including a discharge circuit capable of energizing to a positive electrode and a negative electrode of the battery cell.

In the present application, the deciding portion decides whether the shut-off element of the battery module is operating based on the detection results of the cell voltage detecting portion in a state that current flows in a current path including a diode of which a cathode is connected to a positive electrode of the battery cell and an anode is connected to a negative electrode of the battery cell.

According to the present application, switching wares are set for the plurality of battery modules connected in parallel, and each of the battery modules can be disconnected with respect to the power supply line by using these switching wares. In addition, according to the present application, the voltage detecting portion detects a cell voltage in a state that the battery module is disconnected from the power supply line by using such switching ware, and the deciding portion decides whether the shut-off element is operating. Therefore, according to the present application, it is possible to decide whether the shut-off element is operating in each of the battery modules. Thus, according to the present application, it is possible to detect whether the shut-off element has performed operation in a certain one of the plurality of battery modules connected in parallel, in the voltage detection apparatus for detecting voltage of the battery modules.

DESCRIPTION OF THE EMBODIMENTS

First Embodiment

Figure 1:
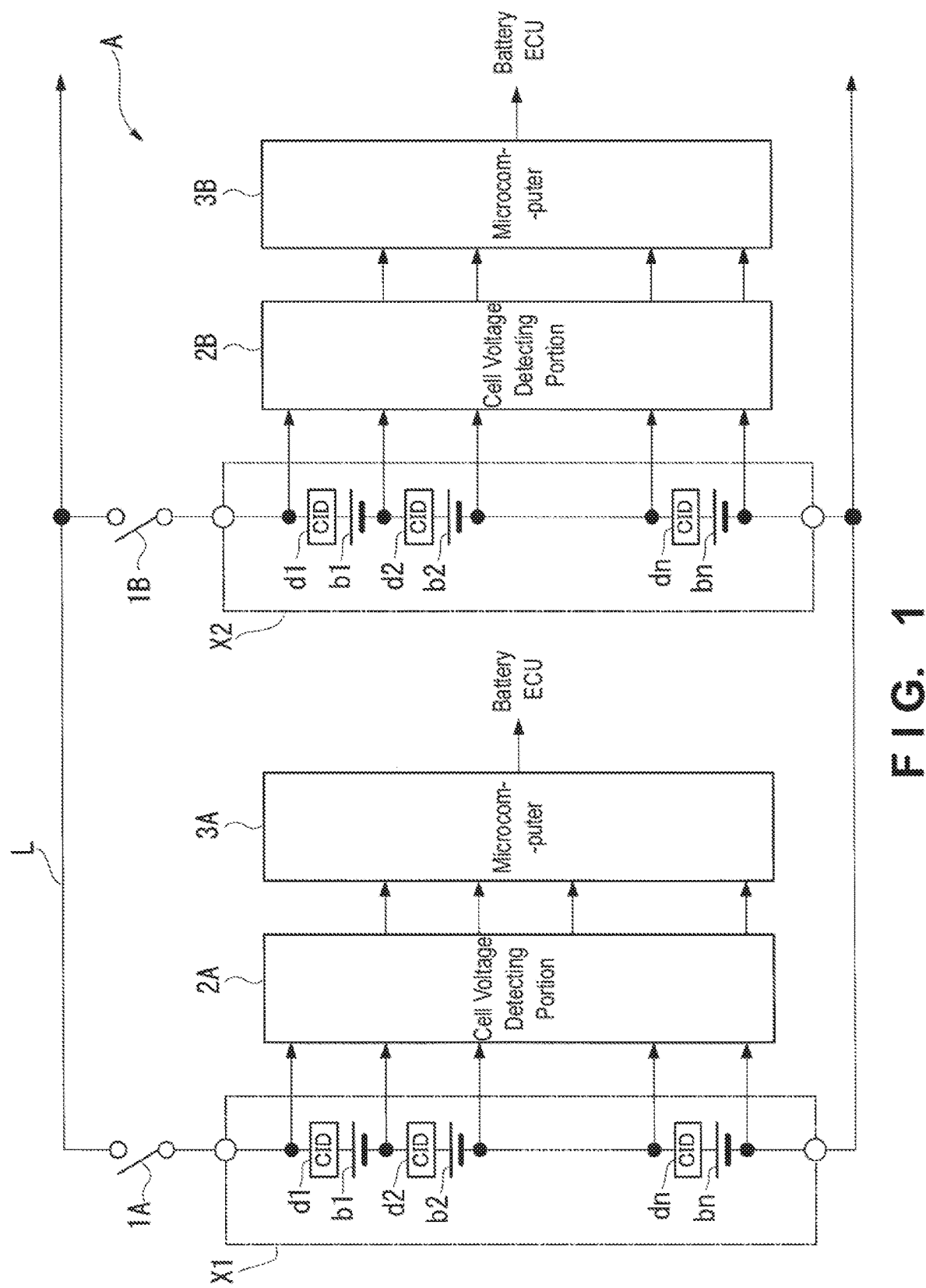
FIG. 1 is a system structure diagram showing a part of a vehicle traveling system with a voltage detection apparatus of the first embodiment of the present invention.

One embodiment of the voltage detection apparatus of the present application will be described below with reference to the drawings. FIG. 1 is a system structure diagram showing a part of a vehicle traveling system with a voltage detection apparatus A of the present embodiment. In the present embodiment, the vehicle traveling system includes a battery having a plurality of battery modules which are connected in parallel to a power supply line L for a load (inverter or the like). In the present embodiment, as shown in FIG. 1, a structure that the battery includes two battery modules (a battery module X1 and a battery module X2) is described. However, the number of the battery modules included in the battery is not limited to two, and the battery may also include three or more battery modules connected in parallel.

In addition, as shown in FIG. 1, the vehicle traveling system in the present embodiment sets, for each battery module (battery module X1 and battery module X2), a switching ware (switching ware 1A and switching ware 1B), a cell voltage detecting portion (cell voltage detecting portion 2A and cell voltage detecting portion 2B) and a microcomputer (microcomputer 3A and microcomputer 3B). The voltage detection apparatus A which decides whether the shut-off element (CID) is operating by detecting the voltage of the battery module includes these switching wares, cell voltage detecting portions and microcomputers.

As shown in FIG. 1, each of the battery module X1 and the battery module X2 is a battery pack formed by connecting n battery cells b1~bn in series. The positive electrode terminal of the battery cell b1 at the top is used as positive electrode terminals of the battery module X1 and the battery module X2, and the negative electrode terminal of the battery cell bn at the bottom is used as negative electrode terminals of the battery module X1 and the battery module X2. In addition, the above "n" is a natural number not smaller than 3.

As shown in the figure, each of the battery cells b1~bn includes each of CIDs d1~dn respectively. Each of the CIDs d1~dn (shut-off element) is set at a positive electrode terminal side of each of the battery cells b1~bn in correspondence with each of the battery cells b1~bn constituting the battery module X1 and the battery module X2, and each of the CIDs d1~dn is a shut-off element (disconnector element) which operates when the internal voltage of the corresponding battery cell rises excessively due to abnormity of this battery cell. These CIDs d1~dn mechanically disconnect the positive terminal of each of the battery cells b1~bn by operation, so as to shut off the connection between the battery cells b1~bn.

The switching ware 1A is provided between the battery module X1 and the power supply line L, and the switching ware 1B is provided between the battery module X2 and the power supply line L. The switching ware 1A connects the positive electrode terminal of the battery module X1 to the power supply line L, and the open/close state of the switching ware 1A is controlled by the microcomputer 3A in the present embodiment. The battery module X1 is disconnected from the power supply line L by opening the switching ware 1A, and the battery module X1 is connected to the power supply line L by closing the switching ware 1A.

The switching ware 1B connects the positive electrode terminal of the battery module X2 to the power supply line L, and the open/close state of the switching ware 1B is controlled by the microcomputer 3B in the present embodiment. The battery module X2 is disconnected from the power supply line L by opening the switching ware 1B, and the battery module X2 is connected to the power supply line L by closing the switching ware 1B.

The cell voltage detecting portion 2A is connected to a wiring for transferring terminal voltage of each terminal of n battery cells b1~bn of the battery module X1, and calculates difference in voltages between terminals of each of the battery cells b1~bn transferred by the wiring, as voltage (cell voltage) of each of the battery cells b1~bn. In addition, the cell voltage detecting portion 2A outputs signal indicating the calculated cell voltage.

The cell voltage detecting portion 2B is connected to a wiring for transferring terminal voltage of each terminal of n battery cells b1~bn of the battery module X2, and calculates difference in voltages between terminals of each of the battery cells b1~bn transferred by the wiring, as voltage (cell voltage) of each of the battery cells b1~bn. In addition, the cell voltage detecting portion 2B outputs signal indicating the calculated cell voltage.

The microcomputer 3A and the microcomputer 3B are so-called one chip microcomputers which are integrally assembled with a central processing unit (CPU) or a memory, an input/output interface or the like. The microcomputer 3A obtains sampling values (cell voltage data) by performing an A/D conversion on cell voltages (detection results) input from the cell voltage detecting portion 2A, and outputs the cell voltage data to a battery ECU. In addition, the microcomputer 3A controls the switching ware 1A based on the specified CID operation detecting program, decides whether the CIDs d1~dn are operating in the battery module X1, and also judges which one of the CIDs d1~dn is operating.

More specifically, the microcomputer 3A, immediately after receiving signal indicating that an ignition of the vehicle is ON or OFF from outside (for example a battery ECU), disconnects the battery module X1 from the power supply line L by opening the switching ware 1A. The microcomputer 3A (deciding portion) thus disconnects the battery module X1 from the power supply line L, and based on the detection results (cell voltage) of the cell voltage detecting portion 2A in a state that current flows in a current path formed inside of the battery module X1, decides whether the CIDs d1~dn are operating and judges which one of the CIDs d1~dn is operating.

For example, if the CID d2 operates, the positive electrode terminal of the battery cell b2 is mechanically disconnected as described above, and a discharge phenomenon or the like occurs in a space formed by the disconnection, such that weak current flows in a current path including a leakage current path existing inside of the CID d2 after operation. Voltage of the negative electrode terminal of the battery cell b1 as a battery cell which is adjacent to the positive electrode terminal side of the battery module X1 of the operated CID d2 becomes lower than voltage at the positive electrode side of the CID d2 due to an external circuit (for example filter or the like which is not shown). Therefore, the above weak current flowing through the leakage current path flows to the battery cell b1 from the battery cell b2. In such state, voltage (i.e., cell voltage) between terminals of the battery cell b2 is detected to be negative voltage, in the detection result of the cell voltage detecting portion 2A. Therefore, in a case where the negative voltage which cannot be detected in general is detected in the cell voltage detecting portion 2A, the microcomputer 3A decides that the CIDs d1~dn are operating in the battery module X1. In addition, the microcomputer 3A judges that the CID d2 is operating in the battery cell b2 corresponding to the cell voltage indicating the negative voltage.

The microcomputer 3B obtains sampling values (cell voltage data) by performing an A/D conversion on cell voltages (detection results) input from the cell voltage detecting portion 2B, and outputs the cell voltage data to a battery ECU. In addition, the microcomputer 3B controls the switching ware 1B based on the specified CID operation detecting program, decides whether the CIDs d1~dn are operating in the battery module X2, and also judges which one of the CIDs d1~dn is operating.

More specifically, the microcomputer 3B, immediately after receiving signal indicating that an ignition of the vehicle is ON or OFF from outside (for example a battery ECU), disconnects the battery module X2 from the power supply line L by opening the switching ware 1B during the period that the switching ware 1A is not opened (i.e., during a period that the battery module other than the battery module X2 is connected to the power supply line). The microcomputer 3B (deciding portion) thus disconnects the battery module X2 from the power supply line L, and based on the detection results (cell voltage) of the cell voltage detecting portion 2B in a state that current flows in a current path formed inside of the battery module X2, decides whether the CIDs d1~dn are operating and judges which one of the CIDs d1~dn is operating, similar to that of the microcomputer 3A.

In the voltage detection apparatus A with such structure of the present embodiment, for example, if the microcomputer 3A receives, from the battery ECU, the signal indicating that the ignition is ON or OFF, the microcomputer 3A opens the switching ware 1A to disconnect the battery module X1 from the power supply line L. At this point, if there are CIDs d1~dn which have operated, the weak current flows in the current path including the leakage current path included in the CIDs d1~dn after operation. In a state that the above battery module X1 is disconnected from the power supply line, the cell voltage detecting portion 2A detects voltage (cell voltage) of the battery cells b1~bn. In a case where the signal indicating the negative voltage is included in the cell voltage input from the cell voltage detecting portion 2A, the microcomputer 3A decides that a certain one of the CIDs d1~dn is operating in the battery module X1, and also determines the battery cells b1~bn indicating the negative voltage as the battery cells b1~bn in which the CIDs d1~dn have operated. Such decision and judgement by the microcomputer 3A for example are output to the battery ECU.

In addition, for example, after the microcomputer 3B receives the signal indicating that the ignition is ON or OFF from the battery ECU, the microcomputer 3B opens the switching ware 1B to disconnect the battery module X2 from the power supply line L. At this point, if there are CIDs d1~dn which have operated, the weak current flows in the current path including the leakage current path included in the CIDs d1~dn after operation. In a state that such battery module X2 is disconnected from the power supply line, the cell voltage detecting portion 2B detects voltage (cell voltage) of the battery cells b1~bn. In a case where the signal indicating the negative voltage is included in the cell voltage input from the cell voltage detecting portion 2B, the microcomputer 3B decides that a certain one of the CIDs d1~dn is operating in the battery module X2, and also determines the battery cells b1~bn indicating the negative voltage as the battery cells b1~bn in which the CIDs d1~dn have operated. Such decision and judgement by the microcomputer 3B for example are output to the battery ECU.

The voltage detection apparatus A according to the above present embodiment sets a switching ware (switching ware 1A and switching ware 1B) for each of a plurality of battery modules (battery module X1 and battery module X2) connected in parallel, so as to enable each of the battery modules to be disconnected from the power supply line L by using these switching wares. In addition, according to the voltage detection apparatus A of the present embodiment, in a state that the battery module is disconnected from the power supply line L by using such switching ware, the cell voltage detecting portions (cell voltage detecting portion 2A and cell voltage detecting portion 2B) detect the cell voltage, and the microcomputers (microcomputer 3A and microcomputer 3B) decide whether the CIDs d1~dn are operating. Therefore, the voltage detection apparatus A according to the present embodiment can judge whether the CIDs d1~dn are operating in each of the battery modules.

In addition, in the voltage detection apparatus A of the present embodiment, in a case where a result indicating that the cell voltage is the negative voltage is included in the detection results of the cell voltage detecting portions (cell voltage detecting portion 2A and cell voltage detecting portion 2B), the microcomputers (microcomputer 3A and microcomputer 3B) decide that a certain one of the CIDs d1~dn of the battery modules (battery module X1 and battery module X2) is operating. Therefore, it is possible to decide whether a certain one of the CIDs d1~dn is operating by a simple deciding processing.

In the voltage detection apparatus A of the above present embodiment, it is possible to ensure the current path when the CIDs d1~dn are operating by using the existing CIDs d1~dn.

Second Embodiment

Next, the second embodiment of the present application will be described with reference to FIG. 2. In addition, in the explanation of the present second embodiment, the parts which are the same as the above first embodiment will be omitted or the explanation thereof is simplified.

Figure 2:
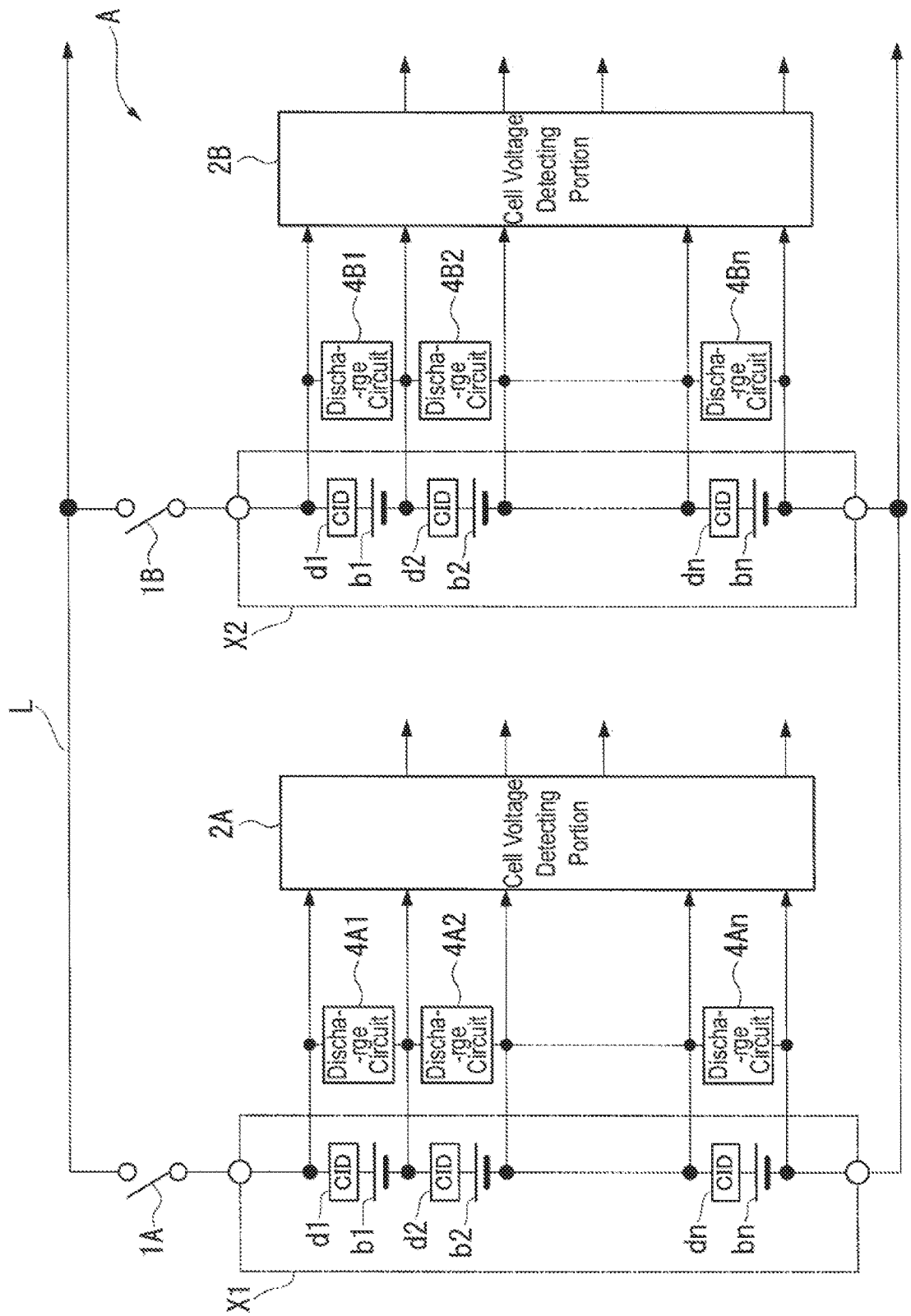
FIG. 2 is a system structure diagram showing a part of a vehicle traveling system with a voltage detection apparatus of the second embodiment of the present invention.

FIG. 2 is a system structure diagram showing a part of a vehicle traveling system with a voltage detection apparatus A of the second embodiment of the present application. In addition, the voltage detection apparatus A of the present embodiment includes the microcomputer 3A and the microcomputer 3B similar to the above first embodiment, but the graphical representation thereof is omitted in FIG. 2 for the purpose of saving paper area.

As shown in FIG. 2, the voltage detection apparatus A of the present embodiment has discharge circuits 4A1~4An and discharge circuits 4B1~4Bn capable of energizing to a positive electrode and a negative electrode of the same battery cells b1~bn. In addition, as these discharge circuits 4A1~4An and discharge circuits 4B1~4Bn, cell equalization circuits for averaging the voltage values of each of the battery cells b1~bn may be used.

The discharge circuits 4A1~4An are set to be connected to the battery module X1 and are connected to the adjacent transferred wiring. Such discharge circuits 4A1~4An have switching elements of which the open/close control is performed by the microcomputer 3A and resistors, and in a case where the switching elements are in an ON state, the power of the corresponding battery cells b1~bn is converted into heat energy by the resistors to be consumed. For example, in a case where the switching element of the discharge circuit 4A2 is in an ON state, the power accumulated in the battery cell b2 corresponding to the battery module X1 is converted into heat energy by the resistor of the discharge circuit 4A2 to be consumed.

The discharge circuits 4B1~4Bn are set to be connected to the battery module X2 and are connected to the adjacent transferred wiring. Such discharge circuits 4B1~4Bn have switching elements of which the open/close control is performed by the microcomputer 3B and resistors, and in a case where the switching elements are in an ON state, the power of the corresponding battery cells b1~bn is converted into heat energy by the resistors to be consumed. For example, in a case where the switching element of the discharge circuit 4B2 is in an ON state, the power accumulated in the battery cell b2 corresponding to the battery module X2 is converted into heat energy by the resistor of the discharge circuit 4B2 to be consumed.

In the above embodiment, for example, if the microcomputer 3A receives, from the battery ECU, the signal indicating that the ignition is ON or OFF, the microcomputer 3A causes the switching elements of the discharge circuits 4A1~4An to sequentially become the ON state in chronological order, after opening the switching ware 1A to disconnect the battery module X1 from the power supply line L. At this point, if there are the CIDs d1~dn which have operated, current of which direction is inverse to the normal state flows via the corresponding discharge circuits 4A1~4An. In a state that the battery module X1 is thus disconnected from the power supply line, the cell voltage detecting portion 2A detects voltage (cell voltage) of the battery cells b1~bn. In a case where the cell voltage input from the cell voltage detecting portion 2A includes the signal indicating the negative voltage, the microcomputer 3A decides that a certain one of the CIDs d1~dn in the battery module X1 is operating, and also determines the battery cells b1~bn indicating the negative voltage as the battery cells b1~bn in which the CIDs d1~dn have operated. Such decision and judgment by the microcomputer 3A are output to the battery ECU for example.

In addition, for example, if the microcomputer 3B receives, from the battery ECU, the signal indicating that the ignition is ON or OFF, the microcomputer 3B causes the switching elements of the discharge circuits 4B1~4Bn to sequentially become the ON state in chronological order, after opening the switching ware 1B to disconnect the battery module X2 from the power supply line L. At this point, if there are the CIDs d1~dn which have operated, current of which direction is inverse to the normal state flows via the corresponding discharge circuits 4B1~4Bn. In a state that the battery module X2 is thus disconnected from the power supply line, the cell voltage detecting portion 2B detects voltage (cell voltage) of the battery cells b1~bn. In a case where the cell voltage input from the cell voltage detecting portion 2B includes the signal indicating the negative voltage, the microcomputer 3B decides that a certain one of the CIDs d1~dn in the battery module X2 is operating, and also determines the battery cells b1~bn indicating the negative voltage as the battery cells b1~bn in which the CIDs d1~dn have operated. Such decision and judgment by the microcomputer 3B are output to the battery ECU for example.

In the voltage detection apparatus A of the present embodiment as described above, similar to the above first embodiment, it is also possible to ensure the current path when the CIDs d1~dn are operating by using the existing cell equalization circuit.

In addition, before the switching elements of the discharge circuits 4A1~4An are caused to sequentially become the ON state in chronological order, the switching elements of all the discharge circuits 4A1~4An are caused to simultaneously become the ON state, and if no abnormal current flows in this case, it can also be judged that the CIDs d1~dn of the battery module X1 are not operating, so as not to perform processing of causing the switching elements of the discharge circuits 4A1~4An to sequentially become the ON state in chronological order. For the discharge circuits 4B1~4Bn, it is also like this.

Third Embodiment

Next, the third embodiment of the present application will be described with reference to FIG. 3. In addition, in the explanation of the present third embodiment, the parts which are the same as the above first embodiment will be omitted or the explanation thereof is simplified.

Figure 3:
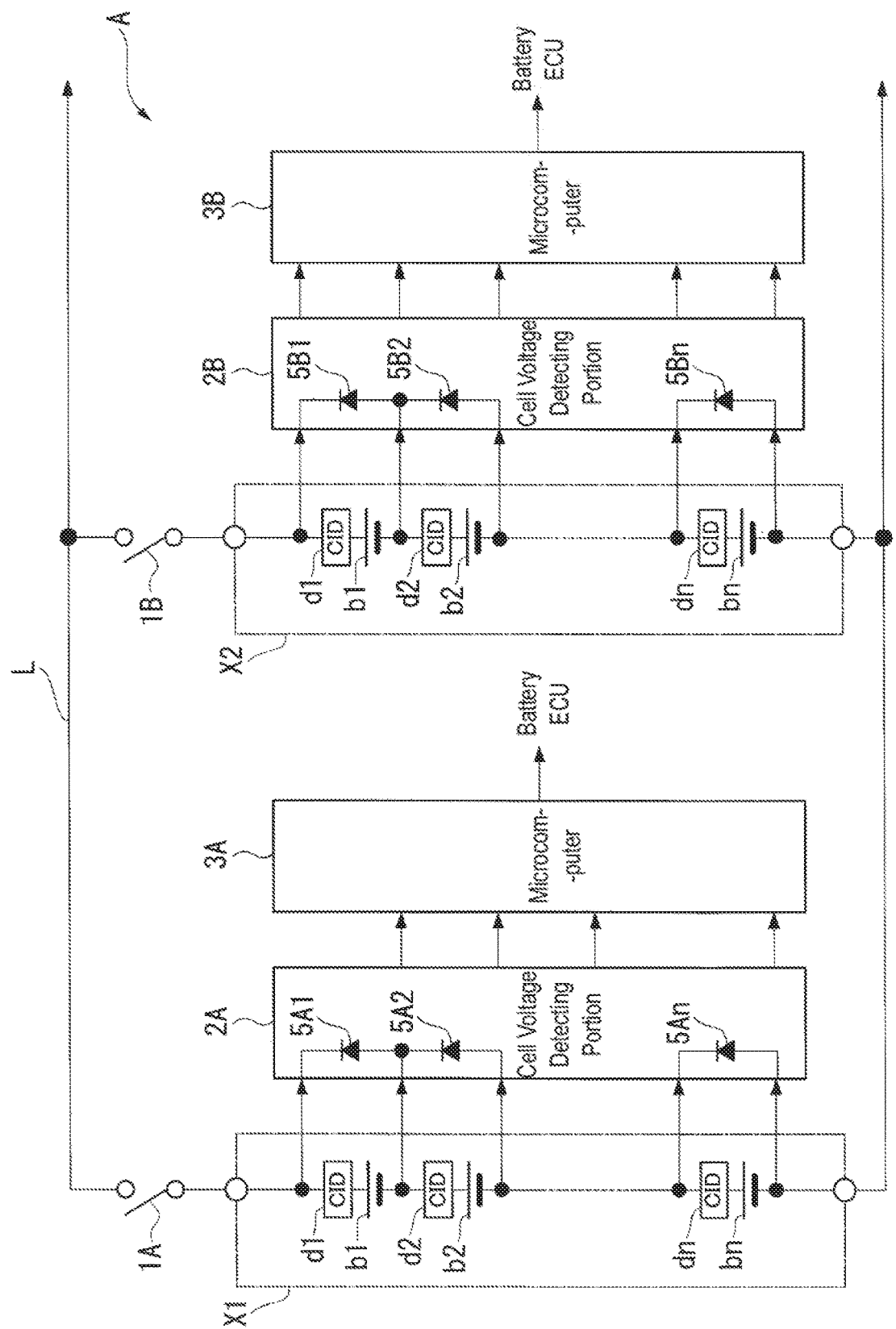
FIG. 3 is a system structure diagram showing a part of a vehicle traveling system with a voltage detection apparatus of the third embodiment of the present invention.

FIG. 3 is a system structure diagram showing a part of a vehicle traveling system with a voltage detection apparatus A of the third embodiment of the present application. As shown in this figure, in the voltage detection apparatus A of the present embodiment, the cell voltage detecting portion 2A includes protection diodes 5A1~5An of which the cathodes are connected to the positive electrodes of the battery cells b1~bn of the battery module X1 and the anodes are connected to the negative electrodes of the battery cells b1~bn. In addition, the cell voltage detecting portion 2B includes protection diodes 5B1~5Bn of which the cathodes are connected to the positive electrodes of the battery cells b1~bn of the battery module X2 and the anodes are connected to the negative electrodes of the battery cells b1~bn.

The current when the CIDs d1~dn operate can flow through the current path including the protection diodes 5A1~5An and the protection diodes 5B1~5Bn, by including such protection diodes 5A1~5An and protection diodes 5B1~5Bn. Therefore, in the present embodiment, it is also possible to ensure the current path when the CIDs d1~dn are operating by using the existing protection diodes 5A1~5An and protection diodes 5B1~5Bn.

In addition, for example, in a case where the switching element of the discharge circuit of the above second embodiment includes a parasitic diode, the protection diode of the present embodiment may be replaced with the parasitic diode. In addition, in a case where an integrated circuit included in the cell voltage detecting portion 2A and the cell voltage detecting portion 2B includes a parasitic diode, it is also like this.

Hereinbefore, although the preferred embodiment of the present application has been described with reference to drawings, the present invention is not limited to the above embodiments obviously. Various kinds of shapes, combinations or the like of each component shown in the above embodiments are only one example, and various modifications can be made based on the design requirements or the like without departing from the scope of the gist of the present invention.

For example, in the above embodiments, a structure of deciding that a certain one of the CIDs d1~dn has operated in a case where the cell voltage is the negative voltage is described. However, the present invention is not limited to this, and for example, a structure of deciding that a certain one of the CIDs d1~dn has operated in a case where the cell voltage exceeds a certain range specified in advance may also be adopted.

EXPLANATION FOR REFERENCE SIGNS

1A: Switching ware; 1B: Switching ware; 2A: Cell Voltage Detecting Portion; 2B: Cell Voltage Detecting Portion; 3A: Microcomputer (Deciding Portion); 3B: Microcomputer (Deciding Portion); 4A1~4An: Discharge Circuit; 4B1~4Bn: Discharge Circuit; 5A1~5An: Protection Diode (Diode); 5B1~5Bn: Protection Diode (Diode); A: Voltage Detection Apparatus; b1~bn: Battery Cell; d1~dn: CID (Shut-Off Element); L: Power Supply Line; X1: Battery Module; X2: Battery Module

What is claimed is:
1. A voltage detection apparatus which detects voltage of a plurality of battery modules, each of the plurality of battery modules having a shut-off element and being connected in parallel with respect to a load, the voltage detection apparatus comprises:
　　a switching ware configured to set for each of the plurality of battery modules and connect each of the plurality of battery modules to a power supply line for the load;
　　a cell voltage detecting circuit configured to detect voltage of a battery cell included in each of the plurality of battery modules in a state that each of the plurality of battery modules is disconnected from the power supply line by the switching ware; and a processor configured to decide whether the shut-off element of each of the plurality of battery modules is operating based on detection results of the cell voltage detecting circuit, wherein the processor decides that the shut-off element of each of the plurality of battery modules is operating, in a case where a result indicating that voltage of the battery cell is negative voltage is included in the detection results of the cell voltage detecting circuit.

2. The voltage detection apparatus according to claim 1, wherein the processor decides whether the shut-off element of each of the plurality of battery modules is operating based on the detection results of the cell voltage detecting circuit in a state that current flows in a current path including a leakage current path included in the shut-off element after operation.

3. The voltage detection apparatus according to claim 1, wherein the processor decides whether the shut-off element of each of the plurality of battery modules is operating based on the detection results of the cell voltage detecting circuit in a state that current flows in a current path including a discharge circuit configured to energize to a positive electrode and a negative electrode of the battery cell.

4. The voltage detection apparatus according to claim 1, wherein the processor decides whether the shut-off element of each of the plurality of battery modules is operating based on the detection results of the cell voltage detecting circuit in a state that current flows in a current path including a diode of which a cathode is connected to a positive electrode of the battery cell and an anode is connected to a negative electrode of the battery cell.

5. The voltage detection apparatus according to claim 1, wherein the processor is configured to decide whether the shut-off element of each of the plurality of battery modules is operating in a shut-off state based on the detection results of the cell voltage detecting circuit.

6. A voltage detection apparatus which detects voltage of a plurality of battery modules, each of the plurality of battery modules having a shut-off element and being connected in parallel with respect to a load, the voltage detection apparatus comprises:

a switching ware configured to set for each of the plurality of battery modules and connect each of the plurality of battery modules to a power supply line for the load;

a cell voltage detecting circuit configured to detect voltage of a battery cell included in each of the plurality of battery modules in a state that each of the plurality of battery modules is disconnected from the power supply line by the switching ware; and a processor configured to decide whether the shut-off element of each of the plurality of battery modules is operating based on detection results of the cell voltage detecting circuit, wherein the processor decides whether the shut-off element of each of the plurality of battery modules is operating based on the detection results of the cell voltage detecting circuit in a state that current flows in a current path including a diode of which a cathode is connected to a positive electrode of the battery cell and an anode is connected to a negative electrode of the battery cell.

* * * * *